(12) United States Patent
Kim et al.

(10) Patent No.: US 7,824,561 B2
(45) Date of Patent: Nov. 2, 2010

(54) METHOD FOR MANUFACTURING PROBE STRUCTURE

(75) Inventors: Bong Hwan Kim, Seoul (KR); Bum Jin Park, Seoul (KR); Jong Bok Kim, Goyang-si (KR); Chi Woo Lee, Incheon (KR)

(73) Assignee: Will Technology Co., Ltd., Gyeonggi-do (KR)

( * ) Notice: Subject to any disclaimer, the term of this patent is extended or adjusted under 35 U.S.C. 154(b) by 555 days.

(21) Appl. No.: 11/782,949

(22) Filed: Jul. 25, 2007

(65) Prior Publication Data

US 2008/0029479 A1 Feb. 7, 2008

(30) Foreign Application Priority Data

Aug. 4, 2006 (KR) .................... 10-2006-0073790

(51) Int. Cl.
*B44C 1/22* (2006.01)

(52) U.S. Cl. ............................ 216/11; 216/2; 216/41; 216/79; 438/705

(58) Field of Classification Search .............. 216/11, 216/41

See application file for complete search history.

(56) References Cited

U.S. PATENT DOCUMENTS

| | | | | |
|---|---|---|---|---|
| 3,597,667 | A * | 8/1971 | Horn | 257/411 |
| 6,059,982 | A * | 5/2000 | Palagonia et al. | 216/11 |
| 6,784,071 | B2 * | 8/2004 | Chen et al. | 438/401 |
| 2005/0051515 | A1 * | 3/2005 | Nam | 216/27 |
| 2007/0293053 | A1 * | 12/2007 | Kim et al. | 438/736 |

* cited by examiner

*Primary Examiner*—Binh X Tran
*Assistant Examiner*—Stephanie Duclair
(74) *Attorney, Agent, or Firm*—Sughrue Mion, PLLC

(57) ABSTRACT

A method for manufacturing a probe structure is disclosed. In accordance with the method, two semiconductor substrates having different crystal directions are bonded and selectively etched utilizing an etch selectivity due to the different crystal directions to form a probe tip region and a probe beam region. A cantilever structure for a probe card is formed by filling the probe tip region and the probe beam region with a conductive material.

14 Claims, 4 Drawing Sheets

METHOD FOR MANUFACTURING PROBE STRUCTURE

BACKGROUND OF THE INVENTION

1. Field of the Invention

The present invention relates to a method for manufacturing a probe structure, and more particularly to a method for manufacturing a probe structure wherein a wet etching process is facilitated by bonding two semiconductor substrates having different crystal directions to form the probe structure.

2. Description of the Related Art

As a semiconductor technology progresses, a density of a cantilever structure used for a probe card is also increasing. Generally, a conventional method for forming the cantilever structure includes forming a mask layer pattern defining the cantilever structure is formed on a silicon substrate, etching the silicon substrate using the mask layer pattern as an etching mask, and filling the etched portion of the silicon substrate.

However, a drawback of the conventional method is that a selective etching process is difficult to carry out because only one silicon substrate is used. Particularly, when a tip region of the cantilever structure is etched, a beam region of the cantilever structure is also etched. In order to overcome the drawback, a separate mask layer covering the beam region should be formed. Therefore, the etching process is complex and a cost thereof is increased.

SUMMARY OF THE INVENTION

It is an object of the present invention to provide a method for manufacturing a probe structure wherein a wet etching process is facilitated by bonding two semiconductor substrates having different crystal directions to form the probe structure.

In accordance with the present invention, there is provided a method for manufacturing a probe structure, the method comprising steps of: (a) bonding a first semiconductor substrate having a first crystal direction and a second semiconductor substrate having a second crystal direction different from the first crystal direction; (b) etching the second semiconductor substrate and the first semiconductor substrate to form a probe tip region; (c) etching the second semiconductor substrate to form a probe beam region; and (d) filling the probe tip region and the probe beam region to form a probe structure including a probe tip and a probe beam.

It is preferable that the first semiconductor substrate includes a silicon substrate having a crystal direction of <100> and the second semiconductor substrate includes a silicon substrate having a crystal direction of <111>.

Preferably, the step (b) comprises: (b-1) forming a second protective layer pattern on the second semiconductor substrate, the second protective layer pattern defining the probe tip region; (b-2) etching the second semiconductor substrate using the second protective layer pattern as a mask to expose the first semiconductor substrate; (b-3) etching the exposed first semiconductor substrate; and (b-4) removing the second protective layer pattern.

It is preferable that the second protective layer pattern comprises one of a TEOS (Tetra Ethyl Ortho Silicate) layer and a polymer layer.

Preferably, the step (c) comprises: (c-1) forming a first protective layer pattern on the second semiconductor substrate, the first protective layer pattern defining the probe beam region; (c-2) etching the second semiconductor substrate using the first protective layer pattern as a mask; and (c-3) removing the first protective layer pattern.

It is preferable that the first protective layer pattern comprises one of a TEOS (Tetra Ethyl Ortho Silicate) layer and a polymer layer.

The method in accordance with the present invention may further comprise: forming an insulation film in the probe beam region and the probe tip region; removing the insulation film at bottom portions of the probe beam region and the probe tip region; and etching the first semiconductor substrate at the bottom portion of the probe tip region after carrying out the step (c).

Preferably, the removal of the insulation film comprises a wet etching process.

It is preferable that the insulation film comprises one of an oxide film and a nitride film.

The method in accordance with the present invention may further comprise etching the first semiconductor substrate at a bottom portion of the probe tip region after carrying out the step (c).

Preferably, the etching of the first semiconductor substrate comprises a wet etching process.

It is preferable that the step (d) comprises: (d-1) forming a seed layer on surfaces of the probe beam region and the probe tip region; and (d-2) carrying out an electroplating process to form the probe structure.

The method in accordance with the present invention may further comprise planarizing the second semiconductor substrate to reduce a thickness of the second semiconductor substrate after carrying out the step (a).

In accordance with the present invention, there is also provided a method for manufacturing a probe structure, the method comprising steps of: (a) bonding a first semiconductor substrate having a crystal direction of <100> and a second semiconductor substrate having a crystal direction of <100>; (b) sequentially forming a first protective layer pattern and a second protective layer pattern on the second semiconductor substrate, the first protective layer pattern and the second protective layer pattern defining the probe beam region and the probe tip region, respectively; (c) etching the second semiconductor substrate and the first semiconductor substrate using the second protective layer pattern as a mask to form the probe tip region; (d) removing the second protective layer pattern; (e) etching the second semiconductor substrate using the first protective layer pattern as the mask to form the probe beam region; (f) removing the first protective layer pattern; (g) forming an insulation film in the probe beam region and the probe tip region; (h) removing the insulation film at bottom portions of the probe beam region and the probe tip region; (i) etching the first semiconductor substrate at the bottom portion of the probe tip region; (j) filling the probe tip region and the probe beam region to form a probe structure including a probe tip and a probe beam.

DETAILED DESCRIPTION OF THE INVENTION

The present invention will now be described in detail with reference to the accompanied drawings. The interpretations of the terms and wordings used in Description and Claims should not be limited to common or literal meanings. The embodiments of the present invention are provided to describe the present invention more thoroughly for those skilled in the art.

FIGS. 1a through 1k are cross-sectional views illustrating a method for manufacturing a probe structure in accordance with the present invention.

Figure 1A:
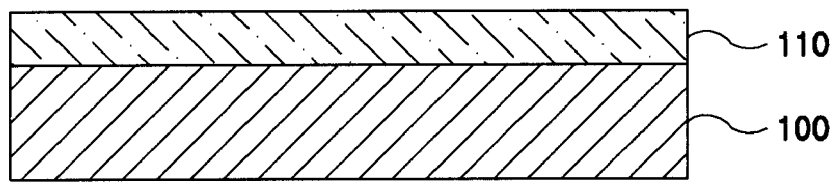
FIGS. 1a through 1k are cross-sectional views illustrating a method for manufacturing a probe structure in accordance with the present invention.

Referring to FIG. 1a, a first semiconductor substrate 100 having a first crystal direction and a second semiconductor substrate 110 having a second crystal direction are bonded. The first crystal direction differs from the second crystal direction. For instance, the first semiconductor substrate 100 may be a silicon substrate having a crystal direction of <100> and the second semiconductor substrate 110 may be a silicon substrate having a crystal direction of <111>. When the semiconductor substrates having the different crystal directions are used, a selective etching process is facilitated. Therefore, a desired portion of the substrate may be accurately etched to a desired depth. In addition, after bonding the first semiconductor substrate 100 and the second semiconductor substrate 110, the second semiconductor substrate 110 may be planarized via a CMP (Chemical Mechanical Polishing) process to reduce a thickness of the second semiconductor substrate 110 until the thickness of the second semiconductor substrate 110 is that of a probe beam to be formed.

Figure 1B:
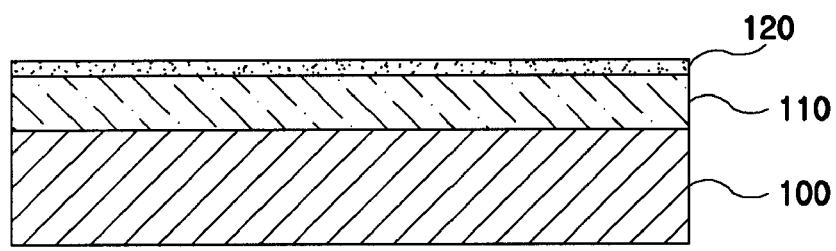

Referring to FIG. 1b, a first protective layer 120 is formed on the second semiconductor substrate 110. It is preferable that the first protective layer 120 may include one of a TEOS (Tetra Ethyl Ortho Silicate) layer and a polymer layer.

Figure 1C:
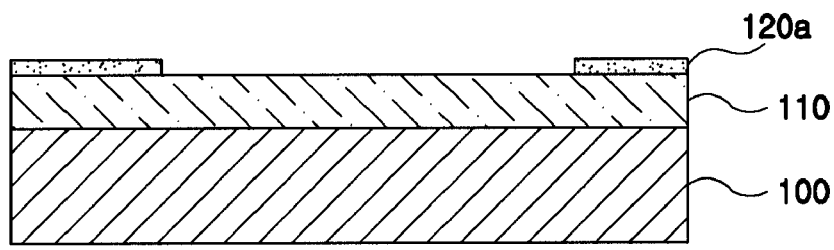

Referring to FIG. 1c, a photoresist film pattern (not shown) defining a probe beam region is formed on the first protective layer 120 and the first protective layer 120 is then etched using the photoresist film pattern as a etching mask to form a first protective layer pattern 120a defining a probe beam region 150. Thereafter, the photoresist film pattern is removed.

Figure 1D:
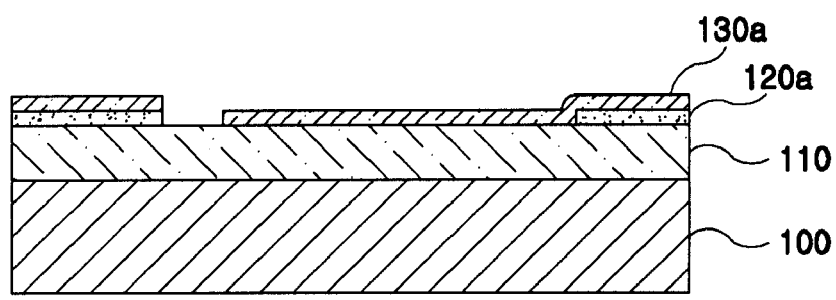

Referring to FIG. 1d, a second protective layer (not shown) is formed on an entire surface of the second semiconductor substrate 110 including the first protective layer pattern 120a, and a photoresist film pattern (not shown) defining a probe tip region is formed on the second protective layer. It is preferable that the second protective layer may include one of the TEOS (Tetra Ethyl Ortho Silicate) layer and the polymer layer.

Thereafter, the second protective layer is etched using the photoresist film pattern as the etching mask to form a second protective layer pattern 130a defining the probe tip region 160. Thereafter, the photoresist film pattern is removed.

Figure 1E:
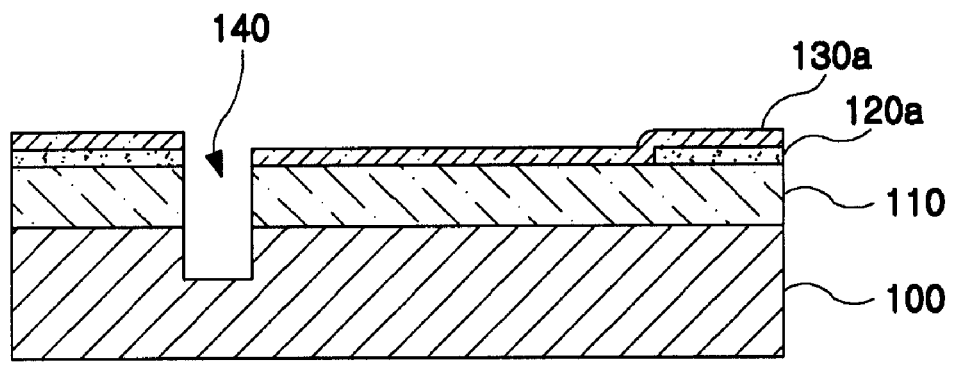

Referring to FIG. 1e, the second semiconductor substrate 110 is etched using the second protective layer pattern 130a as the etching mask until the first semiconductor substrate 100 is exposed. Thereafter, the exposed first semiconductor substrate 100 is etched to form a probe tip region 140. The second protective layer pattern 130a is then removed.

Figure 1F:
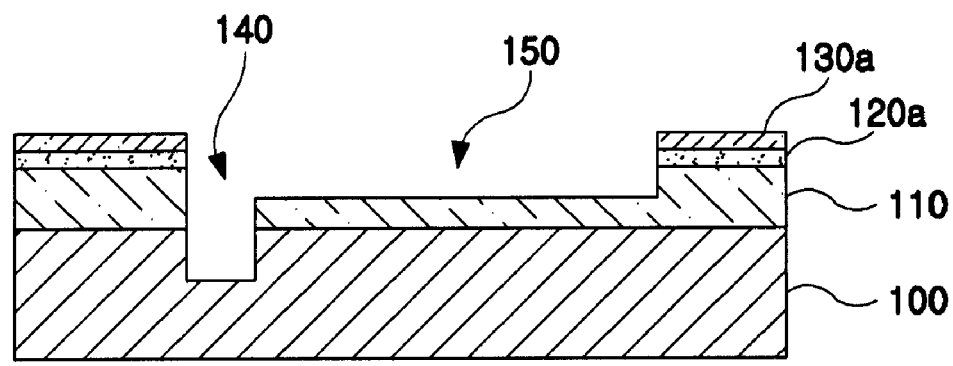

Referring to FIG. 1f, a predetermined thickness of the second semiconductor substrate is etched 110 using the first protective layer pattern 120a as the etching mask to form the probe beam region 150. Thereafter, the first protective layer pattern 120a is removed.

Figure 1G:
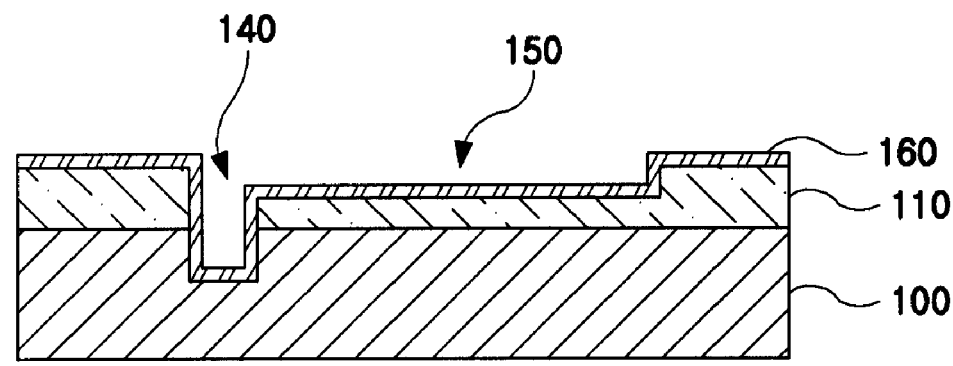

Referring to FIG. 1g, an insulation film 160 is formed in the probe beam region 150 and the probe tip region 140. It is preferable that the insulation film 160 comprises an oxide film or a nitride film.

Figure 1H:
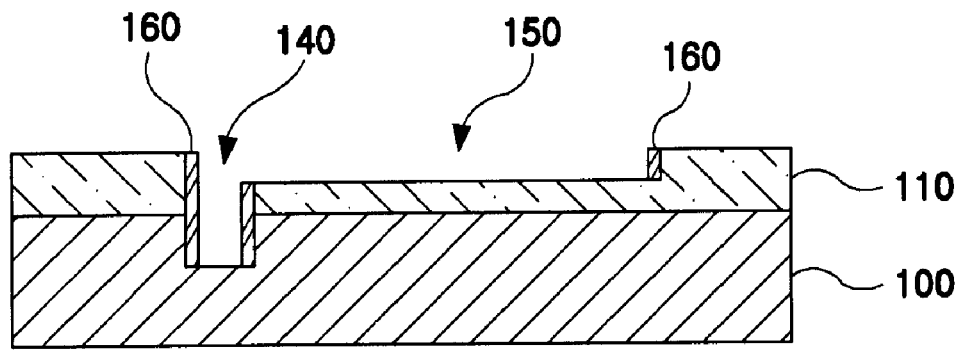

Referring to FIG. 1h, the insulation film 160 at bottom portions of the probe beam region 150 and the probe tip region 140 is removed. It is preferable that the removal of the insulation film 160 is carried out by a wet etching process.

Figure 1I:
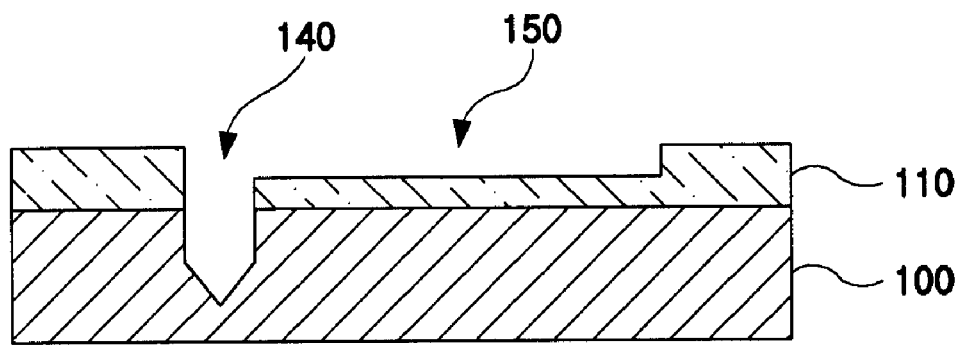

Referring FIG. 1i, the first semiconductor substrate 100 at the bottom portion of the probe tip region 140 is etched. It is preferable that the etching process of the first semiconductor substrate 100 is carried out by the wet etching process. Because an etching characteristic of the first semiconductor substrate 100 differs from that of the second semiconductor substrate 110 due to the different crystal directions, the etching process of FIG. 1i may be carried out selectively for the first semiconductor substrate 100. Therefore, an accurate etching process is possible even when the wet etching is employed.

Figure 1J:
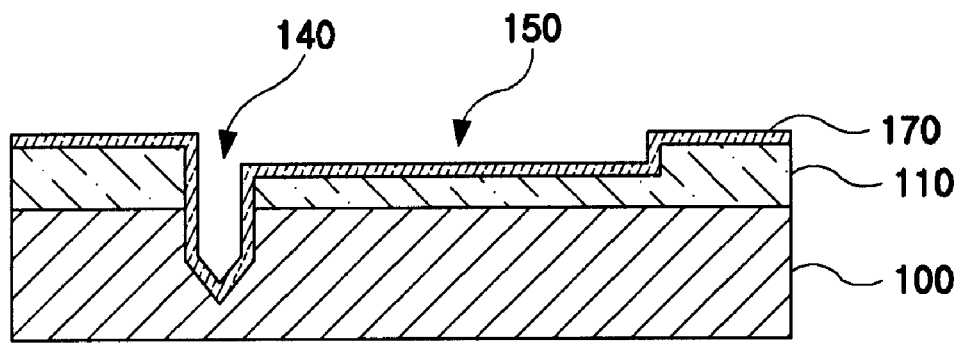

Referring to FIG. 1j, a seed layer 170 is formed on surfaces of the probe beam region 150 and the probe tip region 140.

Figure 1K:
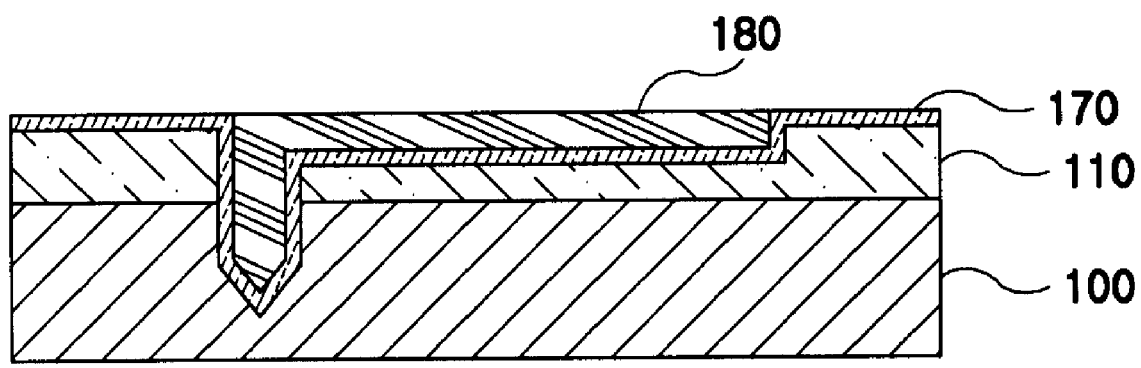

Referring to FIG. 1k, the probe tip region 140 and the probe beam region 150 are filled up with a conductive material to form a probe structure 180 including a probe tip and a probe beam. It is preferable that the probe structure 180 is formed via an electroplating process.

Although not shown, the probe structure may be bonded to a space transformer, and the first semiconductor substrate 100 and the second semiconductor substrate 110 are then removed to form a probe card.

As described above, the method in accordance with the present invention is advantageous in that the wet etching process is facilitated and a manufacturing cost is reduced by bonding the two semiconductor substrates having the different crystal directions to form the probe structure.

What is claimed is:

1. A method for manufacturing a probe structure, the method comprising steps of:
   (a) bonding a first semiconductor substrate having a first crystal direction and a second semiconductor substrate having a second crystal direction different from the first crystal direction;
   (b) etching the second semiconductor substrate and the first semiconductor substrate to form a probe tip region;
   (c) etching the second semiconductor substrate to form a probe beam region; and
   (d) filling the probe tip region and the probe beam region to form a probe structure including a probe tip and a probe beam.

2. The method in accordance with claim 1, wherein the first semiconductor substrate includes a silicon substrate having a crystal direction of <100> and the second semiconductor substrate includes a silicon substrate having a crystal direction of <111>.

3. The method in accordance with claim 1, wherein the step (b) comprises:
   (b-1) forming a second protective layer pattern on the second semiconductor substrate, the second protective layer pattern defining the probe tip region;
   (b-2) etching the second semiconductor substrate using the second protective layer pattern as a mask to expose the first semiconductor substrate;
   (b-3) etching the exposed first semiconductor substrate; and
   (b-4) removing the second protective layer pattern.

4. The method in accordance with claim 3, wherein the second protective layer pattern comprises one of a TEOS (Tetra Ethyl Ortho Silicate) layer and a polymer layer.

5. The method in accordance with claim 1, wherein the step (c) comprises:
   (c-1) forming a first protective layer pattern on the second semiconductor substrate, the first protective layer pattern defining the probe beam region;
   (c-2) etching the second semiconductor substrate using the first protective layer pattern as a mask; and
   (c-3) removing the first protective layer pattern.

6. The method in accordance with claim 5, wherein the first protective layer pattern comprises one of a TEOS (Tetra Ethyl Ortho Silicate) layer and a polymer layer.

7. The method in accordance with claim 1, after carrying out the step (c), further comprising:
   forming an insulation film in the probe beam region and the probe tip region;
   removing the insulation film at bottom portions of the probe beam region and the probe tip region; and
   etching the first semiconductor substrate at the bottom portion of the probe tip region.

8. The method in accordance with claim 7, wherein the removal of the insulation film comprises a wet etching process.

9. The method in accordance with claim 7, wherein the insulation film comprises one of an oxide film and a nitride film.

10. The method in accordance with claim 1, further comprising etching the first semiconductor substrate at a bottom portion of the probe tip region after carrying out the step (c).

11. The method in accordance with claim 10, wherein the etching of the first semiconductor substrate comprises a wet etching process.

12. The method in accordance with claim 1, wherein the step (d) comprises:
   (d-1) forming a seed layer on surfaces of the probe beam region and the probe tip region; and
   (d-2) carrying out an electroplating process to form the probe structure.

13. The method in accordance with claim 1, further comprising planarizing the second semiconductor substrate to reduce a thickness of the second semiconductor substrate after carrying out the step (a).

14. A method for manufacturing a probe structure, the method comprising steps of:
   (a) bonding a first semiconductor substrate having a crystal direction of <100> and a second semiconductor substrate having a crystal direction of <100>;
   (b) sequentially forming a first protective layer pattern and a second protective layer pattern on the second semiconductor substrate, the first protective layer pattern and the second protective layer pattern defining the probe beam region and the probe tip region, respectively;
   (c) etching the second semiconductor substrate and the first semiconductor substrate using the second protective layer pattern as a mask to form the probe tip region;
   (d) removing the second protective layer pattern;
   (e) etching the second semiconductor substrate using the first protective layer pattern as the mask to form the probe beam region;
   (f) removing the first protective layer pattern;
   (g) forming an insulation film in the probe beam region and the probe tip region;
   (h) removing the insulation film at bottom portions of the probe beam region and the probe tip region;
   (i) etching the first semiconductor substrate at the bottom portion of the probe tip region;
   (j) filling the probe tip region and the probe beam region to form a probe structure including a probe tip and a probe beam.

* * * * *